(12) United States Patent
Kanamaru et al.

(10) Patent No.: US 7,563,109 B2
(45) Date of Patent: Jul. 21, 2009

(54) ELECTRICAL COMPONENT MOUNTING BLOCK AND ELECTRICAL JUNCTION BOX

(75) Inventors: Masahiro Kanamaru, Shizuoka-ken (JP); Makoto Nakayama, Shizuoka-ken (JP); Katsuya Hashimoto, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 9 days.

(21) Appl. No.: 12/014,292

(22) Filed: Jan. 15, 2008

(65) Prior Publication Data

US 2008/0169126 A1    Jul. 17, 2008

(30) Foreign Application Priority Data

Jan. 16, 2007    (JP)    ............................ P2007-007084

(51) Int. Cl.
*H01R 12/00*    (2006.01)
(52) U.S. Cl. ...................... 439/76.2; 439/701
(58) Field of Classification Search ................ 439/76.2, 439/701, 949, 903, 217, 218, 747, 954; 174/535
See application file for complete search history.

(56) References Cited

U.S. PATENT DOCUMENTS

| | | | | |
|---|---|---|---|---|
| 5,618,186 A | * | 4/1997 | Saka et al. ................. | 439/76.2 |
| 5,775,953 A | * | 7/1998 | Yamanashi et al. .......... | 439/701 |
| 5,782,651 A | * | 7/1998 | Konoya ...................... | 439/405 |
| 5,908,322 A | * | 6/1999 | Seki ........................... | 439/212 |
| 2005/0136707 A1 | * | 6/2005 | Kiyota ....................... | 439/76.2 |
| 2005/0208793 A1 | * | 9/2005 | Takeuchi .................... | 439/76.2 |

FOREIGN PATENT DOCUMENTS

JP            10-201047          7/1998

\* cited by examiner

*Primary Examiner*—Renee Luebke
*Assistant Examiner*—Larisa Tsukerman
(74) *Attorney, Agent, or Firm*—Finnegan, Henderson, Farabow, Garrett & Dunner, L.L.P.

(57) ABSTRACT

An electrical junction box includes an accommodation box having an accommodation box body having an accommodation space penetrating trough the accommodation box body up and down and an electrical component mounting block inserted into the accommodation space from either upside thereof or the underside and fixed in the accommodation space. The electrical junction box fiber includes a first locking mechanism arranged between an inner wall of the accommodation box body and an outer wall of a block body to lock up the electrical component mounting block inserted into the accommodation space from its upside and a second locking mechanism arranged between the inner wall of the accommodation box body and the outer wall of the block body to lock up the electrical component mounting block inserted into the accommodation space from the underside.

9 Claims, 6 Drawing Sheets

ELECTRICAL COMPONENT MOUNTING BLOCK AND ELECTRICAL JUNCTION BOX

BACKGROUND OF THE INVENTION

1. Field of the Invention

The present invention relates to an electrical component mounting block such as fusible link block and an electrical junction box comprising the electrical component mounting block and an accommodation box body for accommodating the electrical component mounting block. The so-constructed electrical junction box is arranged in a vehicle body.

2. Description of the Related Art

In general, an electrical junction box for vehicle comprises a combination of various blocks or boxes. Such an electrical junction box is disclosed in Japanese Patent Application (heisei) Laid-open No. 10-201047 representatively. In many cases, an electrical component mounting block is assembled into an accommodation box body-forming the electrical junction box, although there exists a fusible link block which can be fitted or mounted to a vehicle independently.

In assembling the electrical component mounting block (e.g. fusible link block) into the accommodation box body of the electrical junction box, there are one case of inserting the block into the box body from its upside and another case of inserting the block into the box body from the underside. For instance, if a fusible link block has a wire harness extending from its bock body downwardly, it is generally impossible for a worker to assemble the fusible link block into the box body from the upside because the wire harness extending from its bock body downwardly interferes with inserting the block into the box body from its upside.

In such a case, the fusible link block is assembled by inserting it into the accommodation box body from the underside and locking up the same block in the body successively. Alternatively, the fusible link block is inserted into the accommodation box body so as to once penetrate it thereupon shifted to a specified locking position with respect to the box body and finally inserted into the box body from the upside, thereby completing the assembling operation.

Meanwhile, depending on the type and specification of vehicles to be mated with the electrical component mounting block, there are possibilities that it has to be assembled into the accommodation box body from upside and underside. From this point of view, it is desirable that the electrical component mounting block can cope with both of such assembling methods (i.e. assembling from its upside and assembling from the underside). Nevertheless, the conventional electrical component mounting block is directed to unidirectional assembling, that is, either assembling from upside or assembling from underside. Therefore, in spite of the same specification of vehicles, various kinds of electrical components blocks have to be prepared corresponding to the assembling directions disadvantageously.

SUMMARY OF THE INVENTION

Under the circumstances, it is therefore an object of the present invention to provide an electrical component mounting block capable of assembling into an accommodation box body from both its upside and the underside and provide an electrical junction box comprising the electrical component mounting block and the accommodation box body accommodating the block.

A first aspect of the present invention is an electrical component mounting block which can be inserted into an accommodation space defined to penetrate an accommodation box body up and down, the electrical component mounting block comprising: a block body; a plurality of first locking parts provided on an outer wall of the block body, the outer wall opposing an inner wall of the accommodation box body defining the accommodation space, the first locking parts being engageable with a plurality of first accommodation box side locking parts formed on the inner wall of the accommodation box body by inserting the block body into the accommodation space of the accommodation box body from upside of the accommodation space; and a plurality of second locking parts provided on the outer wall of the block body, the second locking parts being engageable with a plurality of second accommodation box side locking parts formed on the inner wall of the accommodation box body by inserting the electrical component mounting block into the accommodation space of the accommodation box body from underside of the accommodation space, wherein the electrical component mounting block is fixed in the accommodation space by inserting the electrical component mounting block into the accommodation space from either the upside or underside of the accommodation space.

According to the first aspect of the invention, when inserting the electrical component mounting block into the accommodation box from its upside, the electrical component mounting block can be fixed in the accommodation space by the first locking part. Further, when inserting the electrical component mounting block into the accommodation box from its underside, the electrical component mounting block can be fixed in the accommodation space by the second locking part. Accordingly, it is possible to insert the electrical component mounting block into the accommodation box from just above and below. Thus, if only inserting the electrical component mounting block, it is possible to fix the electrical component mounting block in place of the accommodation box.

The first locking parts may include a plurality of flexible locking arms each having a slanted surface formed to extend obliquely to an inserting direction of the electrical component mounting block.

With the above configuration, since the first locking parts include the flexible locking arms having the slanted surfaces formed to extend obliquely to the inserting direction of the electrical component mounting block, it is possible to facilitate a worker's inserting of the electrical component mounting block into the accommodation box.

The second locking parts may include a plurality of locking projections being engageable with the second accommodation box side locking parts.

With the above configuration, since the second locking parts include the locking projections which are engageable with the second locking parts of the accommodation box body, when inserting the electrical component mounting block into the accommodation box from its underside, the electrical component mounting block can be fixed in the accommodation space by the locking projections engaging with the second locking parts of the accommodation box body.

A second aspect of the present invention is an electrical junction box comprising: an accommodation box having an accommodation box body provided with an accommodation space penetrating through the accommodation box body up and down; an electrical component mounting block having a block body, the electrical component mounting block inserted into the accommodation space from either upside or underside of the accommodation space and fixed in the accommodation space; a first locking mechanism arranged between an inner wall of the accommodation box body and an outer wall of the block body to lock up the electrical component mounting block, which has been inserted into the accommodation space from the upside of the accommodation space, in the accommodation box; and a second locking mechanism arranged between the inner wall of the accommodation box body and the outer wall of the block body to lock up the electrical component mounting block, which has been inserted into the accommodation space from the underside of the accommodation space, in the accommodation box, wherein, when the electrical component mounting block is accommodated in the accommodation space, the first locking mechanism prevents an upward movement of the electrical component mounting block against the accommodation space, and the second locking mechanism prevents a downward movement of the electrical component mounting block against the accommodation space.

According to the second aspect of the invention, when inserting the electrical component mounting block into the accommodation box from its upside, the electrical component mounting block can be fixed in the accommodation space by the first locking mechanism. Further, when inserting the electrical component mounting block into the accommodation box from its underside, the electrical component mounting block can be fixed in the accommodation space by the second locking mechanism. Accordingly, it is possible to insert the electrical component mounting block into the accommodation box from just above and below. Thus, if only inserting the electrical component mounting block, it is possible to fix the electrical component mounting block in place of the accommodation box.

The first locking mechanism may comprise a pair of first locking parts on the accommodation box's side and the electrical component mounting block's side, the first locking parts on the accommodation box's side may have a locking projection formed on the inner wall of the accommodation box body, and the first locking parts on the electrical component mounting block's side may have a flexible locking arm formed on the outer wall of the block body to engage with the locking projection.

With the above configuration, since the first locking mechanism includes the flexible locking arms formed on the outer wall of the electrical component mounting block, the fixing of the inserted block in the accommodation space of the accommodation box can be accomplished through the flexible locking arms which elastically engage with the locking projections of the accommodation box after climbing over them.

The locking projection may have a slanted surface formed to extend obliquely to an inserting direction of the electrical component mounting block, and the flexible locking arm may have another slanted surface formed to extend obliquely to the inserting direction of the electrical component mounting block.

With the above configuration, since the flexible locking arm has the slanted surface formed to extend obliquely to the inserting direction of the electrical component mounting block, it is possible to facilitate a worker's inserting of the electrical component mounting block into the accommodation box. Additionally, since the locking projection on the accommodation box's side has also the slanted surface formed to extend obliquely to the inserting direction of the electrical component mounting block, the flexible locking arm can climb over the locking projection with ease when the electrical component block is inserted into the accommodation box.

The second locking mechanism may comprise a pair of second locking parts on the accommodation box's side and the electrical component mounting block's side, the second locking parts on the accommodation box's side may have a locking projection formed on the inner wall of the accommodation box body, and the second locking parts on the electrical component mounting block's side may have another locking projection formed on the outer wall of the block body to engage with the locking projection of the accommodation box body.

With the above configuration, since the first locking mechanism includes the flexible locking arm formed on the outer wall of the electrical component mounting block, the fixing of the inserted block in the accommodation space of the accommodation box can be accomplished through the flexible locking arms which elastically engage with the locking projections of the accommodation box after climbing over them.

The locking projection of the accommodation box body may have a slanted surface formed to extend obliquely to an inserting direction of the electrical component mounting block, and a wall of the accommodation box body having the locking projection may be made from material capable of elastic deformation caused by the insertion of the electrical component mounting block.

With the above configuration, since the locking projection of the accommodation box has the slanted surface formed to extend obliquely to the inserting direction of the electrical component mounting block, the locking projection of the electrical component block can climb over the locking projection of the accommodation box with ease to cause it to be deformed elastically.

The first locking mechanism may comprise a pair of first locking parts on the accommodation box's side and the electrical component mounting block's side, a first engagement of the pair of first locking parts may prevent an upward movement of the electrical component mounting block against the accommodation space, the first engagement being preformed by allowing one of the first locking parts to climb over the other one of the first locking parts with an elastic deformation of the other one of the first locking parts or with an elastic deformation of a wall of the accommodation box body or the electrical component mounting block having the other one of the first locking parts when the electrical component mounting block is being inserted into the accommodation space from upside of the accommodation space, the second locking mechanism may comprise a pair of second locking parts on the accommodation box's side and the electrical component mounting block's side, a second engagement of the pair of second locking parts may prevent an downward movement of the electrical component mounting block against the accommodation space, the second engagement being preformed by allowing one of the second locking parts to climb over the other one of the second locking parts with an elastic deformation of the other one of the second locking parts or with an elastic deformation of a wall of the accommodation box body or the electrical component mounting block having the other one of the second locking parts when the electrical component mounting block is being inserted into the accommodation space from underside of the accommodation space.

With the above configuration, when inserting the electrical component mounting block into the accommodation box from its upside, the electrical component mounting block can be fixed in the accommodation space by the first locking mechanism and the second locking mechanism. Further, when inserting the electrical component mounting block into the accommodation box from its underside, the electrical component mounting block can be fixed in the accommodation space by the second locking mechanism and the first locking mechanism. Accordingly, it is possible to insert the electrical component mounting block into the accommodation box from just above and below. Thus, if only inserting the electrical component mounting block, it is possible to fix the electrical component mounting block in place of the accommodation box.

These and other objects and features of the present invention will become more fully apparent from the following description and appended claims taken in conjunction with the accompany drawings.

DESCRIPTION OF THE PREFERRED EMBODIMENT

An embodiment of the present invention will be described with reference to the drawings.

Figure 1:
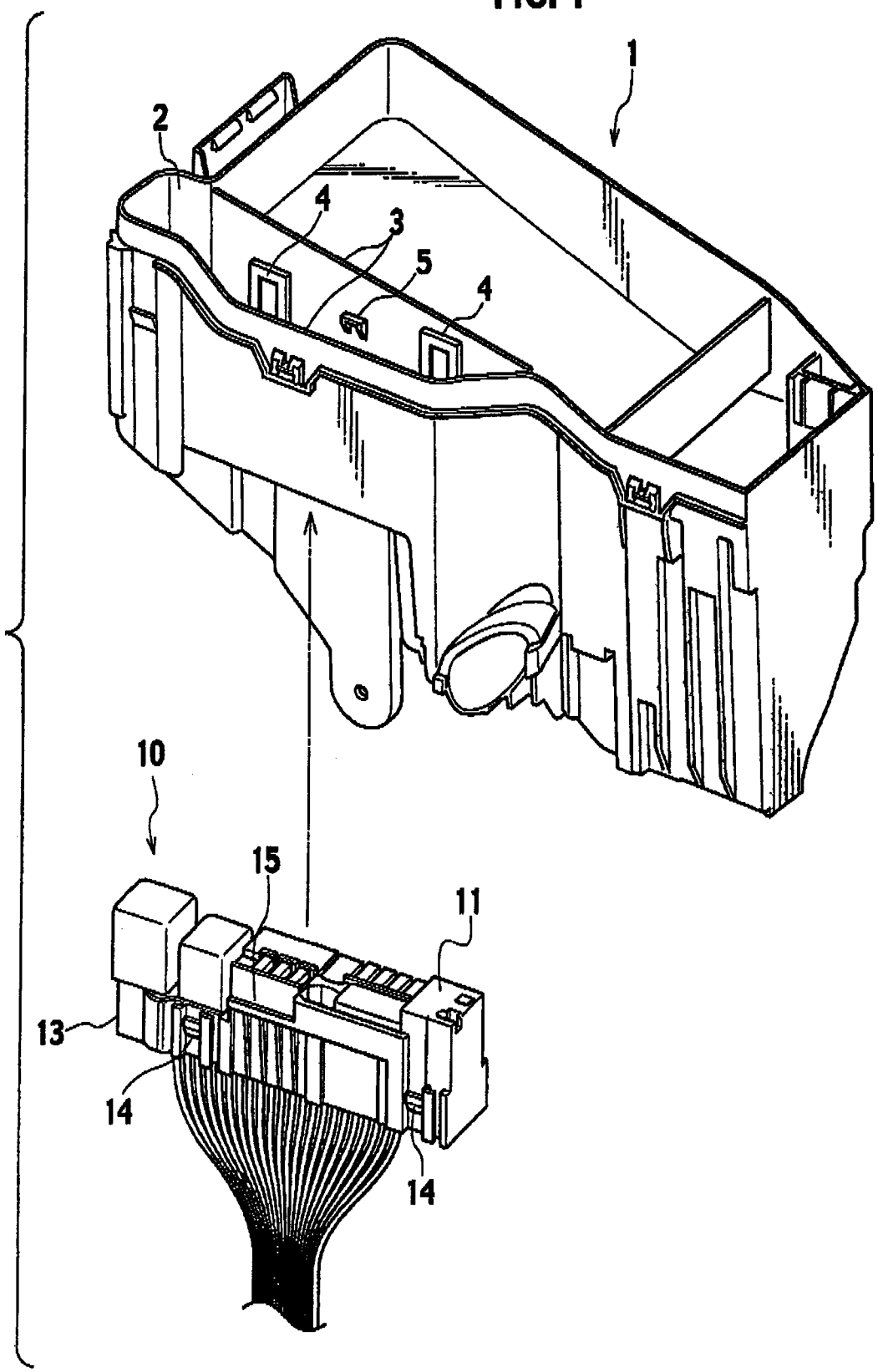
FIG. 1 is a perspective view of an electrical junction box in accordance with an embodiment of the present invention.
Figure 2:
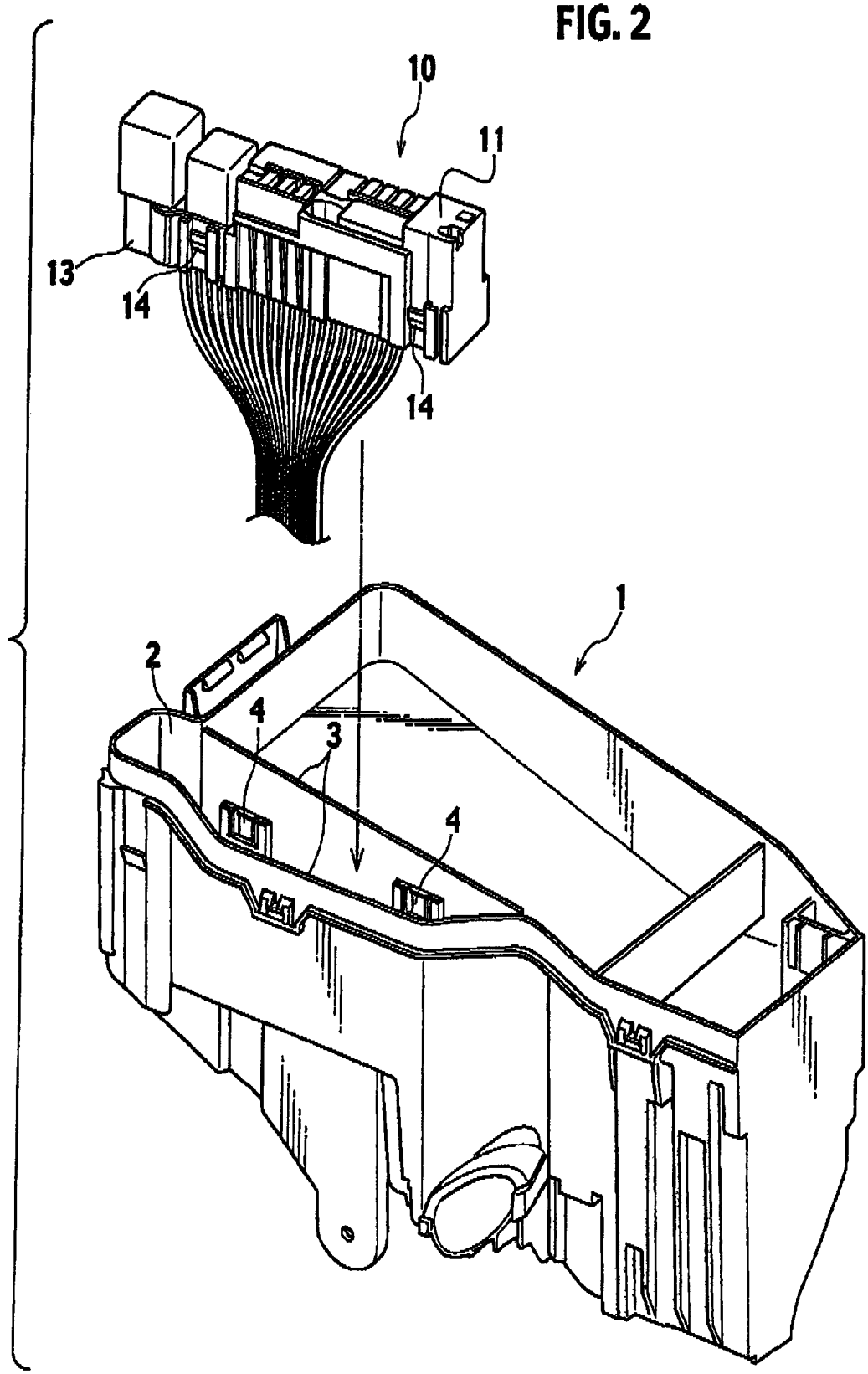
FIG. 2 is a perspective view of another electrical junction box where an accommodation box body is different from that of FIG. 1.
Figure 3:
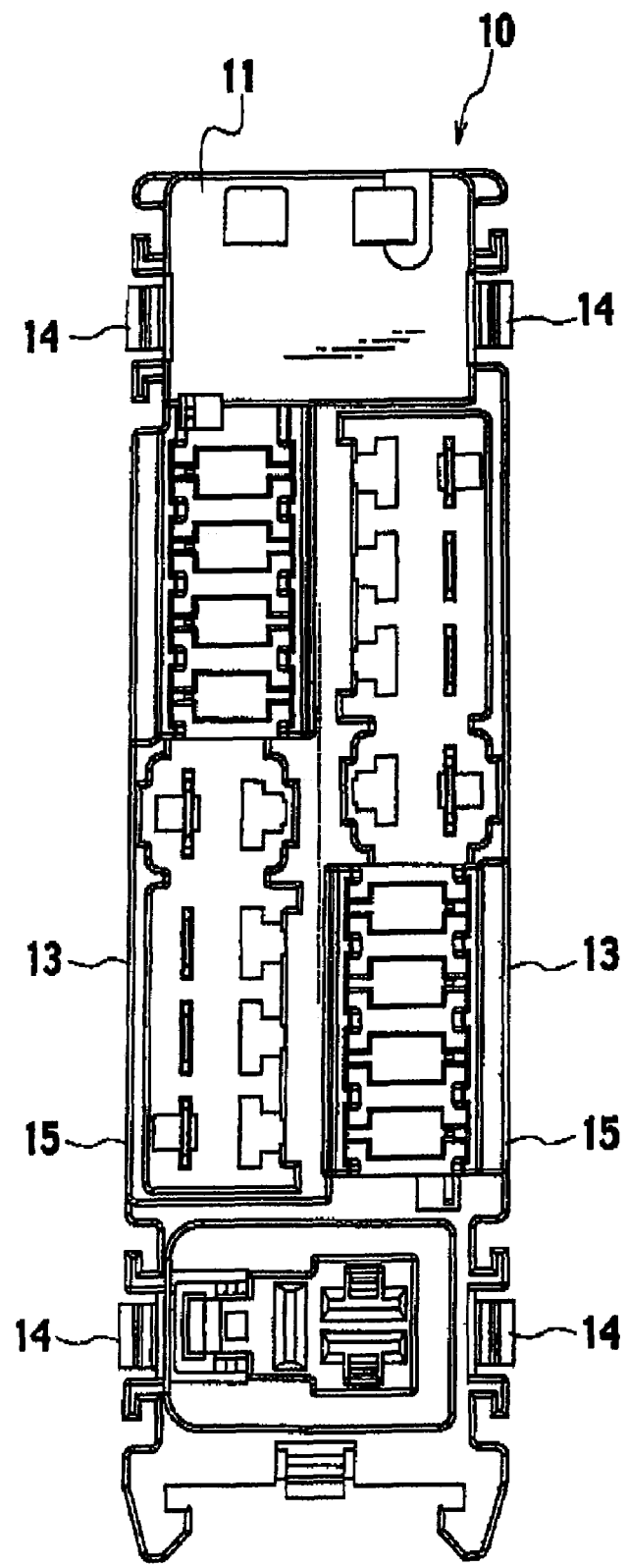
FIG. 3 is a plan view of an electrical component mounting block to be assembled into the accommodation box body of the electrical junction box.
Figure 4:
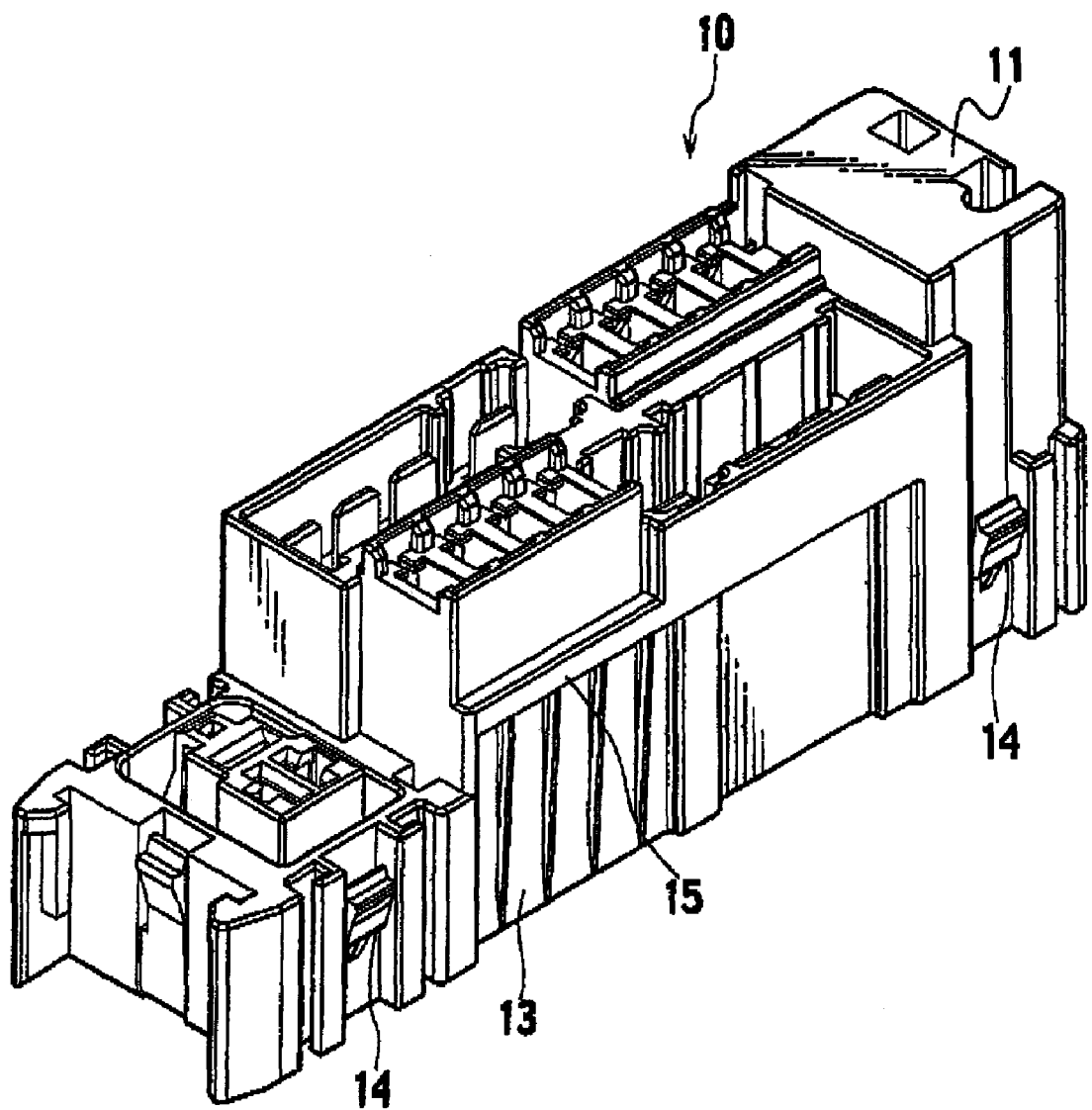
FIG. 4 is a perspective view of the electrical component mounting block of FIG. 3.
Figure 5:
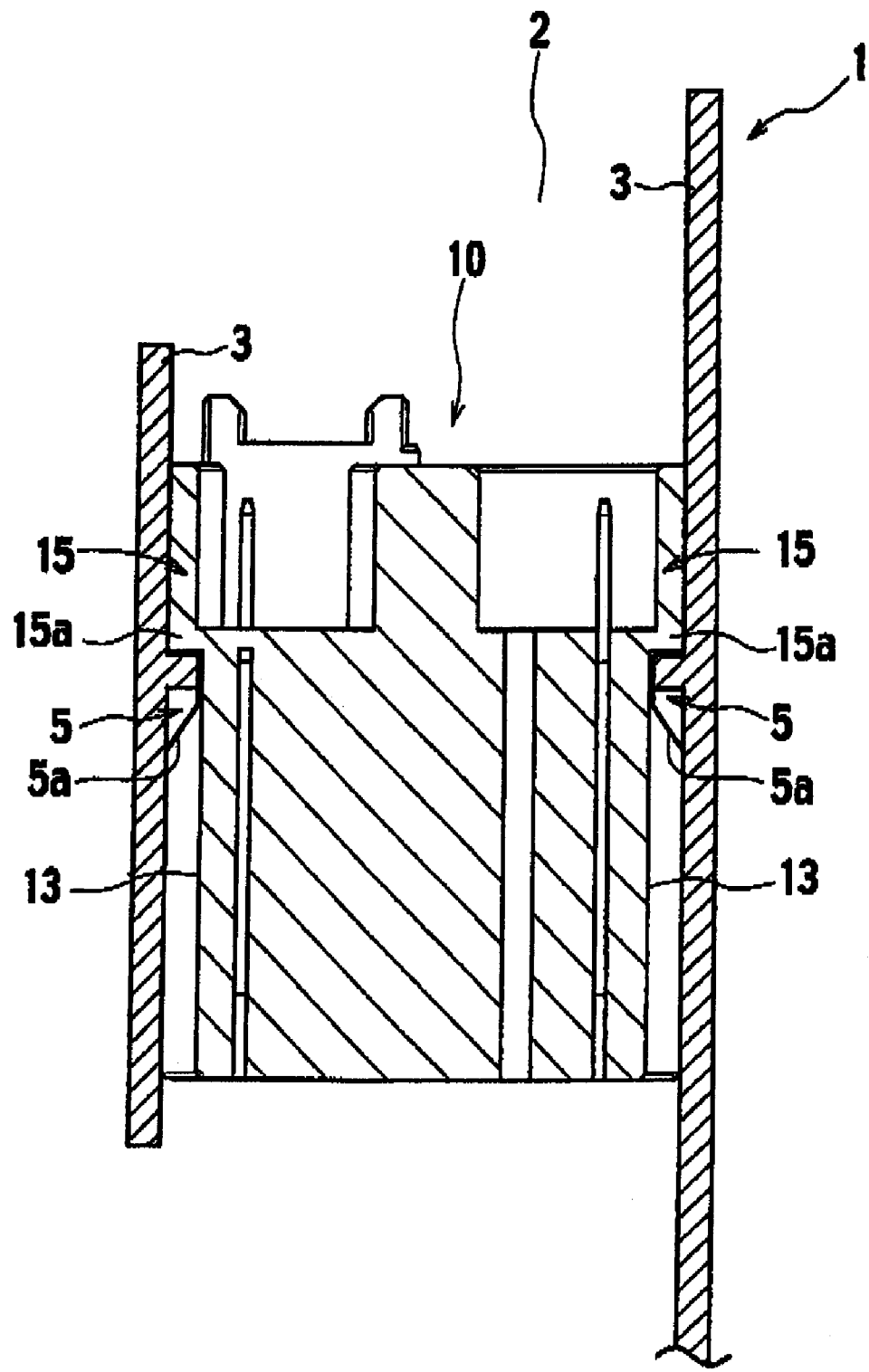
FIG. 5 is a sectional view of the electrical junction box, showing a second locking mechanism to be locked when assembling the electrical component mounting block into the accommodation box body from its underside.
Figure 6:
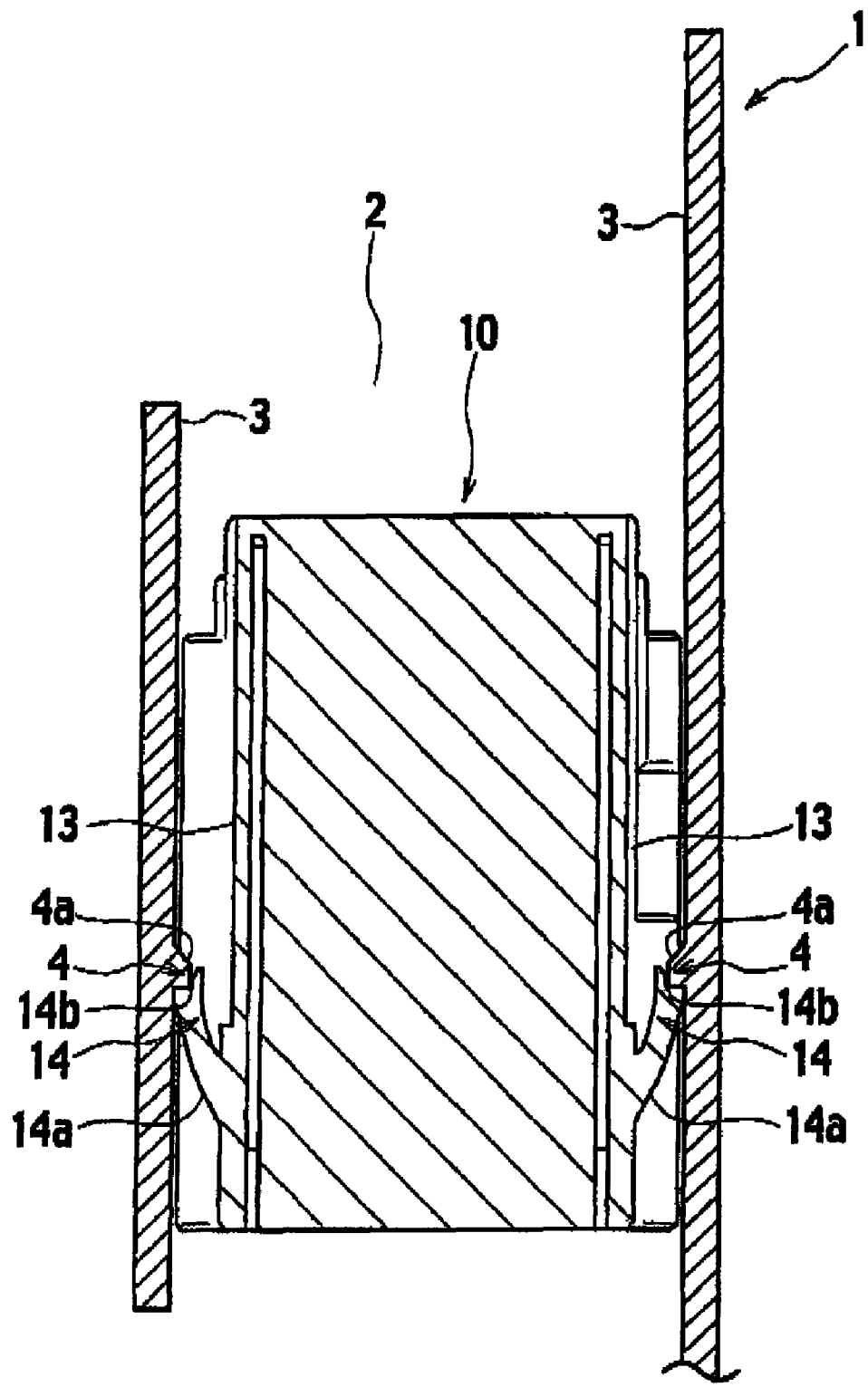
FIG. 6 is a sectional view of the electrical junction box, showing a first locking mechanism to be locked when assembling the electrical component mounting block into the accommodation box body from the upside.

In these figures, FIG. 1 is a perspective view of an electrical junction box in accordance with an embodiment of the present invention, FIG. 2 a perspective view of another electrical junction box where an accommodation box body is different from that of FIG. 1, FIG. 3 a plan view of an electrical component mounting block to be assembled into the accommodation box body of the electrical junction box, FIG. 4 a perspective view of the electrical component mounting block of FIG. 3, FIG. 5 a sectional view of the electrical junction box, showing a second locking mechanism to be locked when assembling the electrical component mounting block into the accommodation box body from its underside, and FIG. 6 is a sectional view of the electrical junction box, showing a first locking mechanism to be locked when assembling the electrical component mounting block into the accommodation box body from the upside.

In FIG. 1, an electrical junction box B comprises an accommodation box body 1 defining an accommodation space 2 formed to penetrate the body 1 up and down and an electrical component mounting block 10 to be inserted into the accommodation space 2 from its upside or the underside and to be fixed in the space 2.

The electrical component mounting block 10 includes a block body 11. Between an inner wall 3 defining the accommodation space 2 and an outer wall 13 of the block body 11 of the electrical component mounting block 10, there are provided a first locking mechanism for locking up the electrical component mounting block 10 in inserting it into the space 2 from the upside and a second locking mechanism for locking up the electrical component mounting block 10 in inserting it into the space 2 from the underside. In the embodiment, the first locking mechanism includes first locking parts 4, 14 for engagement with each other, while the second locking mechanism includes second locking parts 5, 15 for engagement with each other.

In detail, the first locking mechanism includes several pairs of first locking parts (4, 14) on the box body 1 side and the electrical component mounting block 10 side. On the box body 1 side, the first locking parts comprise locking projections 4 formed to project from the inner wall 3 into the space 2. On the other hand, on the electric component mounting block 10 side, the first locking parts comprise flexible locking arms 14 formed on the outer wall 13 of the electrical component mounting block 10 to engage with the locking projection 4 respectively. In operation, when inserting the electrical component mounting block 10 into the accommodation space 2 from the upside, the locking arms 14 of the electrical component mounting block 10 are brought into contact with the locking projections 4 of the box body 1. Then, owing to the flexibility of the locking arms 14, they are elastically deflected by the locking projections 4 to climb over them. As soon as the locking arms 14 have climbed over the locking projections 4, the locking arms 14 are elastically recovered from their deflected state to their original state (non-deflected state), accomplishing the engagement of the locking arms 14 with the locking projections 4, as shown in FIG. 6. With this engagement, the upward movement of the electrical component mounting block 10 can be prevented. Note, in connection with this insertion, each of the locking projections 4 is provided with a slanted surface 4a that extends obliquely to the inserting direction to facilitate the locking arm's climbing-over the locking projection 4 (see FIG. 6). Similarly, each of the locking arms 14 is also provided with a slanted surface 14a that extends obliquely to the inserting direction to facilitate the locking arm's climbing-over the locking projection 4 and with a step part 14b that abuts on the locking projection 4 under the engaged state.

On the other hand, the second locking mechanism includes several pairs of second locking parts (5, 15) on the box body 1 side and the electric component mounting block 10 side. On the box body 1 side, the second locking parts comprise a plurality of locking projections 5 formed to project from the inner wall 3 into the space 2, as shown in FIG. 5. On the other hand, on the electric component mounting block 10 side, the first locking parts comprise a plurality of locking projections 15 formed on the outer wall 13 of the electric component mounting block 10 to engage with the locking projection 5 respectively. In operation, when inserting the electrical component mounting block 10 into the accommodation space 2 of the box body 1 from the underside, the locking projections 15 of the electric component mounting block 10 are brought into contact with the locking projections 5 of the box body 1. Here, it is noted that the box body 1 is made from material capable of elastic deformation. Therefore, with the contact of the locking projections 5 with the locking projections 15, the inner wall 3 of the box body 1 is elastically deflected outward so as to increase a cross sectional area of the accommodation space 2, allowing the locking projections 15 of the electric component mounting block 10 to climb over the locking projections 5 and further proceed toward the upper opening of the box body 1. As soon as respective trailing edges 15a (see FIG. 5) of the locking projections 15 have passed through the locking projections 5, the inner wall 3 of the box body 1 is elastically recovered from its deflected state to their original state (non-deflected state), accomplishing the engagement of the projections 15 with the locking projections 5, as shown in FIG. 5. With this engagement, the downward movement of the electrical component mounting block 10 can be prevented. Note, in connection with this insertion, each of the locking projections 5 is provided with a slanted surface 5a that extends obliquely to the inserting direction to facilitate the elastic deformation of the box body 1 by the locking projections 15 of the electric component mounting block 10.

In this way, according to the so-formed electrical junction box E of the embodiment, when the electrical component mounting block 10 is inserted into the accommodation space 2 of the box body 1 from the upside (see FIG. 2), it is possible to fix the electrical component mounting block 10 with the box body 1 (in the accommodation space 2) since the first locking parts (i.e. the flexible locking arms 14) of the electrical component mounting block 10 engage with the first locking parts (i.e. the locking projections 4) of the box body 1. In this engaged state, the second locking parts (5, 15) prevent the downward movement of the electrical component mounting block 10. On the contrary, when the electrical component mounting block 10 is inserted into the accommodation space 2 of the box body 1 from the underside (see FIG. 1), it is possible to fix the electrical component mounting block 10 with the box body 1 (in the accommodation space 2) since the second locking parts (i.e. the locking projections 15) of the electrical component mounting block 10 engage with the second locking parts (i.e. the locking projections 5) of the box body 1. In this engaged state, the first locking parts (4, 14) prevent the upward movement of the electrical component mounting block 10. Accordingly, in the electrical junction box of the invention, the electrical component mounting block 10 can be inserted into the box body 1 from just above and below. In other words, by only inserting the electrical component mounting block 10, a worker can assemble the electrical component mounting block 10 into the box body 1, realizing the former being fixed in the latter stably.

The inner wall 3 of the box body 1 may be elastically deflected outward so as to increase a cross sectional area of the accommodation space 2, allowing the locking arms 14 of the electric component mounting block 10 to climb over the locking projections 4. Also, the locking projections 4, 5 and 15 may be elastically deflected for guiding the electric component mounting block 10 to an engaged position. A pair of the locking projections 5 and 15 may have the same configuration as a pair of the locking projection 4 and the locking arm 14. In this case, the box body 1 may not be made from material capable of elastic deformation.

It will be understood by those skilled in the art that the foregoing descriptions are nothing but one embodiment of the disclosed electrical component mounting block and the electrical junction box and the modification. In addition to the above modification, various changes and modifications may be made to the present invention without departing from the spirit and scope of the invention.

What is claimed is:

1. An electrical component mounting block which can be inserted into a single accommodation space defined to penetrate an accommodation box body up and down, the electrical component mounting block comprising:
    a block body;
    a plurality of first locking parts provided on an outer wall of the block body, the outer wall opposing an inner wall of the accommodation box body defining the accommodation space, the first locking parts being engageable with a plurality of first accommodation box side locking parts formed on the inner wall of the accommodation box body by inserting the block body into the accommodation space of the accommodation box body from upside of the accommodation space; and
    a plurality of second locking parts provided on the outer wall of the block body, the second locking parts being engageable with a plurality of second accommodation box side locking parts formed on the inner wall of the accommodation box body by inserting the electrical component mounting block into the accommodation space of the accommodation box body from underside of the accommodation space, wherein
    the electrical component mounting block is fixed in the accommodation space by inserting the electrical component mounting block into the accommodation space from either the upside or underside of the accommodation space.

2. The electrical component mounting block as claimed in claim 1, wherein:
    the first locking parts include a plurality of flexible locking arms each having a slanted surface formed to extend obliquely to an inserting direction of the electrical component mounting block.

3. The electrical component mounting block as claimed in claim 1, wherein:
    the second locking parts include a plurality of locking projections being engageable with the second accommodation box side locking parts.

4. An electrical junction box comprising:
    an accommodation box having an accommodation box body provided with a single accommodation space penetrating through the accommodation box body up and down;
    an electrical component mounting block having a block body, the electrical component mounting block inserted into the accommodation space from either upside or underside of the accommodation space and fixed in the accommodation space;
    a first locking mechanism arranged between an inner wall of the accommodation box body and an outer wall of the block body to lock up the electrical component mounting block, which has been inserted into the accommodation space from the upside of the accommodation space, in the accommodation box; and
    a second locking mechanism arranged between the inner wall of the accommodation box body and the outer wall of the block body to lock up the electrical component mounting block, which has been inserted into the accommodation space from the underside of the accommodation space, in the accommodation box,
    wherein, when the electrical component mounting block is accommodated in the accommodation space, the first locking mechanism prevents an upward movement of the electrical component mounting block against the accommodation space, and the second locking mechanism prevents a downward movement of the electrical component mounting block against the accommodation space.

5. The electrical junction box as claimed in claim 4, wherein
    the first locking mechanism comprises a pair of first locking parts on the accommodation box's side and the electrical component mounting block's side,
    the first locking parts on the accommodation box's side has a locking projection formed on the inner wall of the accommodation box body, and
    the first locking parts on the electrical component mounting block's side has a flexible locking arm formed on the outer wall of the block body to engage with the locking projection.

6. The electrical junction box as claimed in claim 5, wherein the locking projection has a slanted surface formed to extend obliquely to an inserting direction of the electrical component mounting block, and the flexible locking arm has another slanted surface formed to extend obliquely to the inserting direction of the electrical component mounting block.

7. The electrical junction box as claimed in claim 5, wherein the locking projection of the accommodation box body has a slanted surface formed to extend obliquely to an inserting direction of the electrical component mounting block, and a wall of the accommodation box body having the locking projection is made from material capable of elastic deformation caused by the insertion of the electrical component mounting block.

8. The electrical junction box as claimed in claim 4, wherein the second locking mechanism comprises a pair of second locking parts on the accommodation box's side and the electrical component mounting block's side, the second locking parts on the accommodation box's side has a locking projection formed on the inner wall of the accommodation box body, and the second locking parts on the electrical component mounting block's side has another locking projection formed on the outer wall of the block body to engage with the locking projection of the accommodation box body.

9. The electrical junction box as claimed in claim 4, wherein the first locking mechanism comprises a pair of first locking parts on the accommodation box's side and the electrical component mounting block's side, a first engagement of the pair of first locking pats prevents an upward movement of the electrical component mounting block against the accommodation space, the first engagement being preformed by allowing one of the first locking parts to climb over the other one of the first locking parts with an elastic deformation of the other one of the first locking parts or with an elastic deformation of a wall of the accommodation box body or the electrical component mounting block having the other one of the first locking parts when the electrical component mounting block is being inserted into the accommodation space from upside of the accommodation space, the second locking mechanism comprises a pair of second locking parts on the accommodation box's side and the electrical component mounting block's side, a second engagement of the pair of second locking parts prevents an downward movement of the electrical component mounting block against the accommodation space, the second engagement being preformed by allowing one of the second locking parts to climb over the other one of the second locking parts with an elastic deformation of the other one of the second locking parts or with an elastic deformation of a wall of the accommodation box body or the electrical component mounting block having the other one of the second locking parts when the electrical component mounting block is being inserted into the accommodation space from underside of the accommodation space.

* * * * *